United States Patent [19]

Kato et al.

[11] Patent Number: 5,380,602

[45] Date of Patent: Jan. 10, 1995

[54] ELECTRICAL APPLIANCE POWERED BY AN INCORPORATED RECHARGEABLE BATTERY

[75] Inventors: Hirokazu Kato; Makoto Tanimizu; Masakazu Kita, all of Hikone, Japan

[73] Assignee: Matsushita Electric Works, Ltd., Osaka, Japan

[21] Appl. No.: 942,266

[22] Filed: Sep. 9, 1992

[30] Foreign Application Priority Data

Sep. 13, 1991 [JP] Japan .................................. 3-233587
Oct. 9, 1991 [JP] Japan .................................. 3-262081

[51] Int. Cl.$^6$ ............................................. H01M 2/26
[52] U.S. Cl. .......................................... 429/123; 320/2
[58] Field of Search ................. 429/49, 100, 121, 133; 320/2

[56] References Cited

U.S. PATENT DOCUMENTS 4,487,820 12/1984 Engelstein et al. .................. 429/100
4,977,042 12/1990 Chiyajo et al. ....................... 429/49

*Primary Examiner*—José G. Dees
*Assistant Examiner*—Samuel Barts
*Attorney, Agent, or Firm*—Stevens, Davis, Miller & Mosher

[57] ABSTRACT

A rechargeable battery is utilized in many kinds of electrical appliances. However, as the battery contains harmful substances such as cadmium, it is not desired to discard the electrical appliances with the rechargeable battery from a standpoint of prevention of environmental pollution. An electrical appliance powered by an incorporated rechargeable battery of the present invention is capable of effectively engaging a tool for separating the battery from the appliance. That is to say, at least one of negative and positive electrodes of the rechargeable battery is connected to a terminal strip by spot welding. An electrical power of the battery is supplied to a circuit for operating the appliance through the terminal strip. The terminal strip also has an opening which is formed so as to engage a tool for separating the battery from the terminal strip. Therefore, when the appliance is discarded, the battery can be easily and safety separated form the electrical appliance by applying an external force to the tool engaged into the opening.

22 Claims, 11 Drawing Sheets

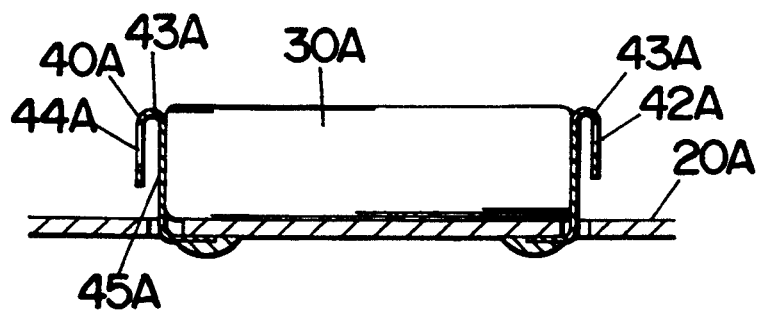
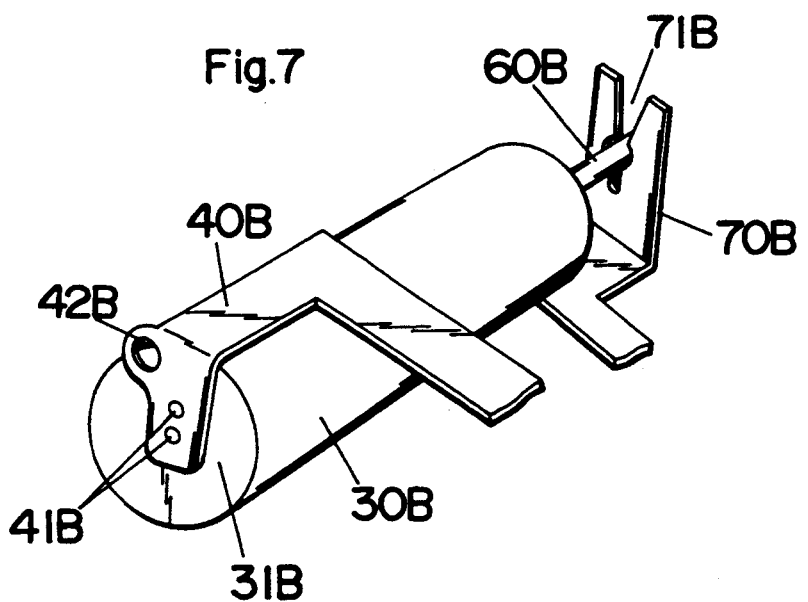
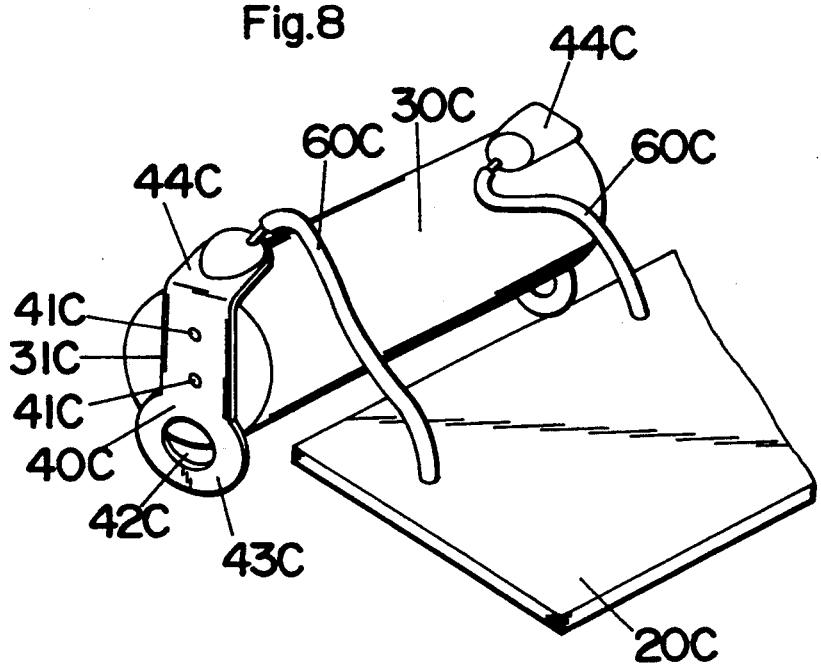

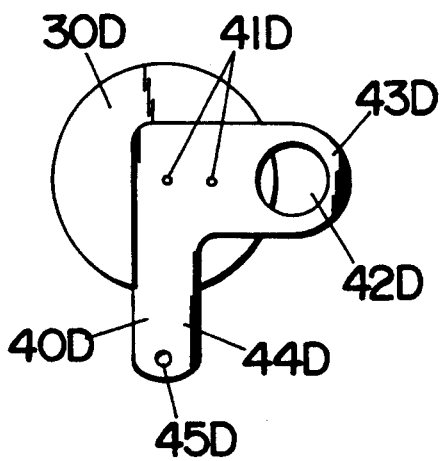
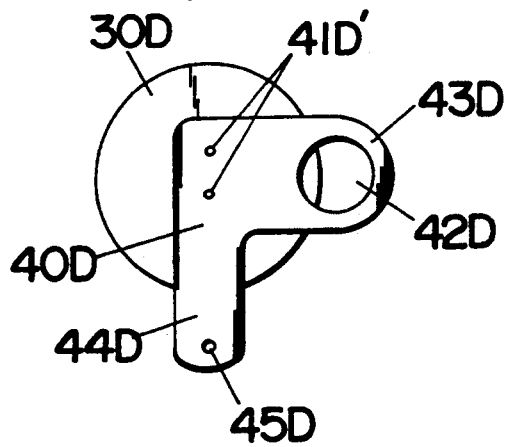
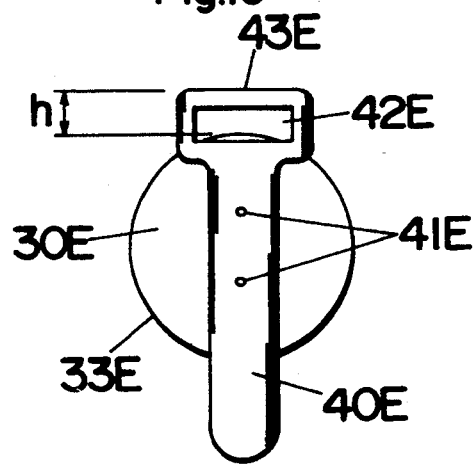
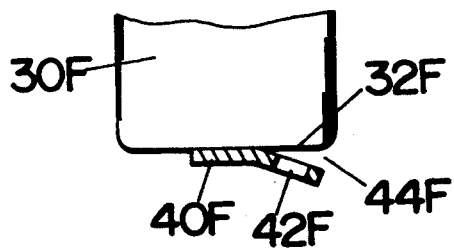
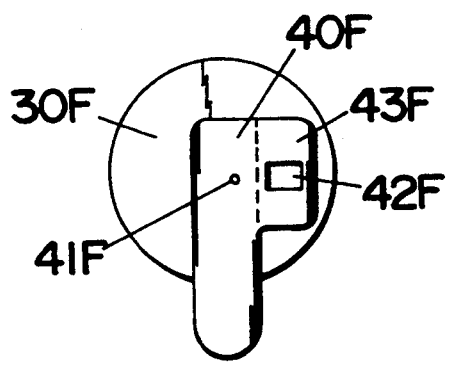

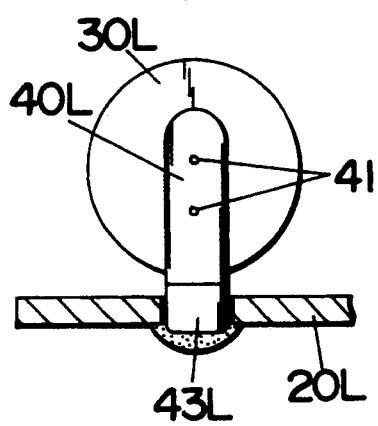
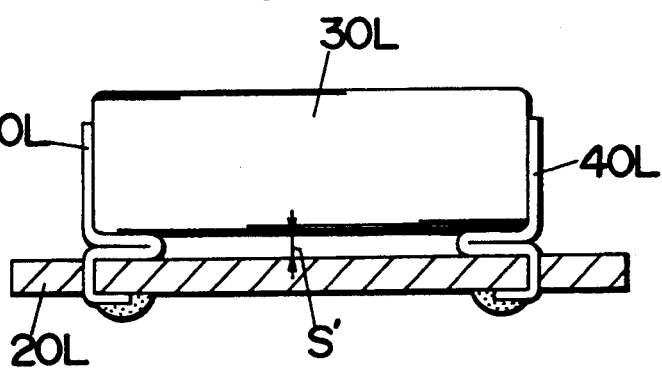
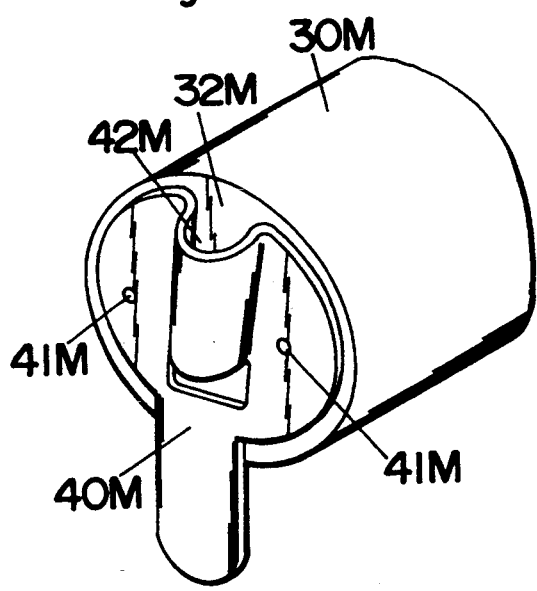
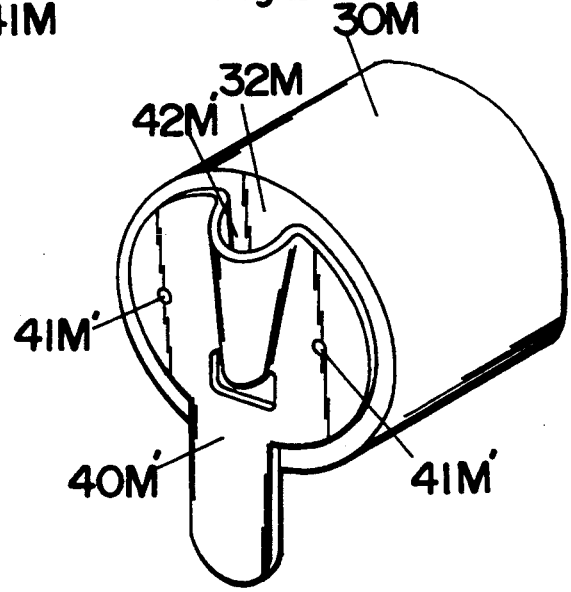

ELECTRICAL APPLIANCE POWERED BY AN INCORPORATED RECHARGEABLE BATTERY

BACKGROUND OF THE INVENTION

1. Field of the Invention

The present invention is directed to an electrical appliance powered by an incorporated rechargeable battery which is capable of effectively engaging a tool for separating the rechargeable battery form the electrical appliance, so that the battery can be easily and safety separated from the appliance by applying an external force to the engaged tool.

2. Description of the Prior Art

A rechargeable battery such as a Ni-Cd (nickel-cadmium) battery is used in an electrical appliance such as a rechargeable electrical shaver. However, as the battery contains harmful substances such as cadmium, it is not desired to discard the electrical appliance with the rechargeable battery from a standpoint of prevention of environmental pollution. Therefore, it is required that the rechargeable battery is easily and safety eliminated from the electrical appliance when being discarded. U.S. Pat. No. 4,977,042 describes that a snap line constituted by a number of pores is formed at the boundary between a battery support plate and a circuit board having an electrical circuit such that the support plate with a rechargeable battery is easily separated at the snap line from the circuit board. However, in fact, it is so difficult to eliminate the battery support plate from the circuit board because of deformation of the circuit board when a bending force is applied thereto. If the support plate is weakly connected with the circuit board by the snap line, the circuit board is often broken with weight of the battery when the electrical appliance is carelessly fallen to the grand. On the other hand, U.S. Pat. No. 4,977,042 also describes that a longitudinal center of the rechargeable battery is placed on a support base fitted on a circuit board such that opposite ends of the rechargeable battery are spaced away from a circuit board, and also a pair of terminal strips disposed on the circuit board are electrically and physically connected with electrodes of the battery, so that each of the terminal strips is separated from the electrode of the battery when a tensile force is applied to the terminal strips by pivotally swinging the rechargeable battery vertically at the support base as a fulcrum with a finger. However, when the tensile force is applied to the terminal strips, the terminal strips are not sometimes separated from the battery because the circuit board is deformed by the tensile force. And besides, it is so difficult to connect the electrodes of the battery with the terminal strips because the battery is unstably placed on the support base when being installed on the circuit board. It is not desired to make a small electrical appliance that a considerably space between the battery and the circuit board is required to brake the terminal strips.

SUMMARY OF THE INVENTION

The above problems and insufficiencies have been improved in the present invention of an electrical appliance powered by an incorporated rechargeable battery which is capable of effectively engaging a tool for separating the rechargeable battery from a circuit board of the electrical appliance. That is to say, the electrical appliance of the present invention comprises a housing incorporating the rechargeable battery having a positive electrode and a negative electrode together with the circuit board carrying an electrical circuit for operating the appliance, a terminal strip having an opening for engaging the tool. Each electrode of the battery is electrically and physically connected to the terminal strip. At least one terminal strip is welded at a welded portion to the electrodes of the battery.

Accordingly, it is a primary object of the present invention to provide an electrical appliance powered by an incorporated rechargeable battery which is capable of easily and safety separating the rechargeable battery from the electrical appliance.

It is also preferred that a notch surrounding the welded portion is formed in the terminal strip such that the terminal strip is cut along the notch while leaving the welded portion adhered to the rechargeable battery when separating the rechargeable battery from the electrical appliance.

It is further preferred that when the terminal strip is welded to one of the electrodes of the rechargeable battery at plural points, the plural points and the opening of the terminal strip are arranged along a straight line.

It is still further preferred that the terminal strip has a constriction between a free end of the terminal strip including the opening and the welded portion, and also made of flexible material such that the free end of the terminal strip can be bent over the remaining portion of the terminal strip along the constriction.

For more complete understanding of the present invention and its construction and advantages, reference should be made to the following description and to the drawings.

BRIEF DESCRIPTION OF THE DRAWINGS

FIG. 6 is a longitudinal cross sectional view illustrating the connection between the battery and the terminal strip of the first modification;

FIG. 7 is a perspective view of the connection between the battery and a terminal strip according to a second modification of the first embodiment;

FIG. 8 is a perspective view illustrating the connection between the battery and a terminal strip according to a 3th modification of the first embodiment;

FIGS. 9A and 9B are respectively end views illustrating the connections between the battery and terminal strip having different welded portions according to a 4th modification of the first embodiment;

FIG. 10 is an end view illustrating the connection between the battery and a terminal strip according to a 5th modification of the first embodiment;

FIGS. 11A and 11B are a side view and an end view, respectively, illustrating the connection between the battery and a terminal strip according to a 6th modification of the first embodiment;

FIGS. 23A and 23B are end view and longitudinal cross sectional view, respectively, illustrating the connection between the battery and the terminal strip after folding a part of the terminal strip of 11th modification;

FIG. 24 is a perspective view illustrating the connection between the battery and a terminal strip having a cylindrical bore in accordance with a second embodiment of the present invention;

FIG. 25 is a perspective view of the connection between the battery and a terminal strip having a tapered cylindrical bore of the second embodiment;

DESCRIPTION OF THE PREFERRED EMBODIMENTS

Figure 1:
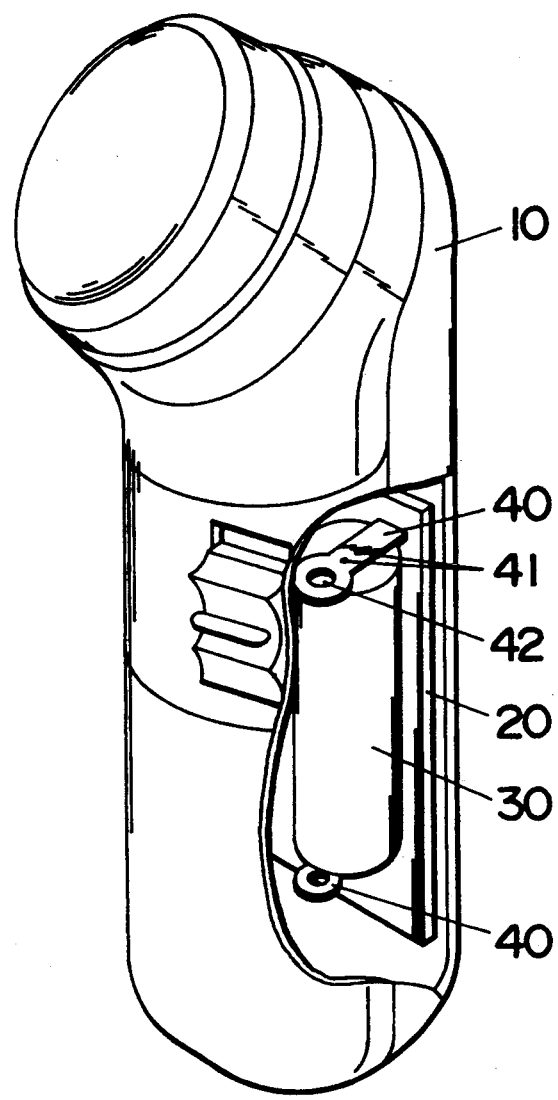
FIG. 1 is a cutaway perspective view of a rechargeable electrical shaver shown as one example of an electrical appliance powered by an incorporated rechargeable battery in accordance with a first embodiment of the present invention.
Figure 2:
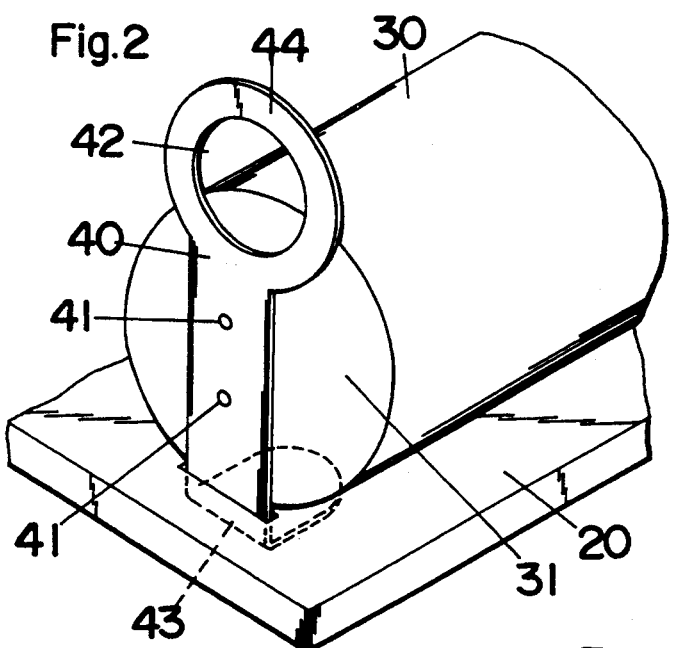
FIG. 2 is a perspective view of a connection between the rechargeable battery and a terminal strip mounted on a circuit board of the first embodiment.
Figure 3:
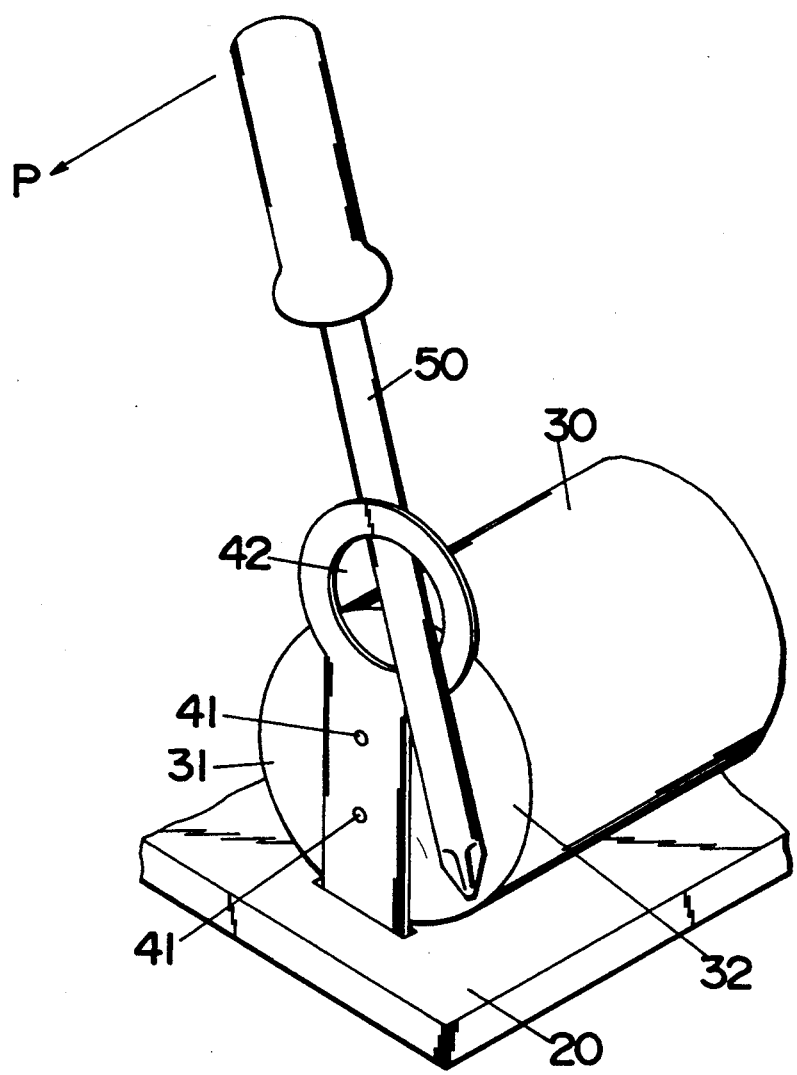
FIG. 3 is a perspective view showing a process for separating the rechargeable battery from the terminal strip according to the first embodiment.
Figure 4:
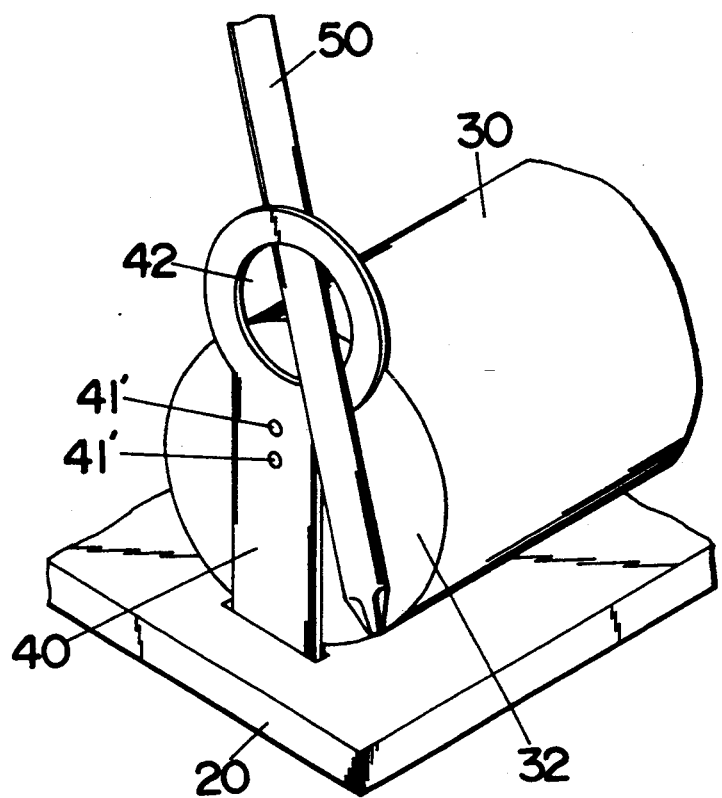
FIG. 4 is a perspective view showing a process for separating the rechargeable battery from a terminal strip which is welded at different positions from FIG. 3 to the battery according to the first embodiment.

A first embodiment of the present invention is illustrated below. A rechargeable electrical shaver as an electrical appliance powered by an incorporated rechargeable battery is shown in FIG. 1. A pair of terminal strips 40 are secured in a circuit board 20 for operating the appliance 10. The rechargeable battery 30 is physically and electrically connected to the circuit board 20 through the terminal strips, which are welded at two welded portions 41 to negative and positive electrodes 31 of the rechargeable battery 30, respectively. The terminal strip 40 is also formed to have a circular opening 42 for engaging a tool for separating the rechargeable battery from the terminal strip. FIG. 2 shows a perspective view of a connection between the rechargeable battery 30 and the terminal strip 40 mounted on the circuit board 20. An anchor end 43 of the terminal strip 40 is secured to the circuit board 20. A free end 44 of the terminal strip is formed with the circular opening 42 which extends beyond the periphery of the battery 30 so as to receive therein the tool. The welded portions 41 and the circular opening 42 are arranged along a straight line. As shown in FIG. 3, for removing the battery 30 from the terminal strip 40, a stick-like tool such as a screwdriver is inserted through the circular opening 42 and is then pivoted or levered with its tip 51 pushed against an end surface 32 of the battery in a direction P of moving a handle of the tool away from the end surface 32, thereby forcibly pulling the terminal strip 40 away from the end surface 32 of the battery 30 to break the welded portions 42 one by one. Consequently, the rechargeable battery 30 is easily separated from the circuit board 20. By the way, if there is enough space, in the electrical appliance 10, for moving the tool 50 engaged into the opening 42 so as to separate the battery 30 from the terminal strip 40, it is preferred that the opening 42 and the two welded portions 41 aide arranged along a straight line in a longitudinal direction of the terminal strip, as shown in FIG. 2. Because the welded portions are broken one by one with applying to the tool 50 a small external force which is about equal to brake one of the welded portions 41. On the other hand, when there is not enough space, in the electrical appliance 10, for moving the tool 50 engaged into the opening 42 so as to separate the battery 30 from the terminal strip 40, it is preferred that two welded portions 41' are arranged near the opening 42 along the longitudinal direction of the terminal strip 40, as shown in FIG. 4. Because the battery 30 can be separated from the terminal strip 40 simply by moving the tool 50 engaged into the opening 42 for a short distance.

Figure 5A:
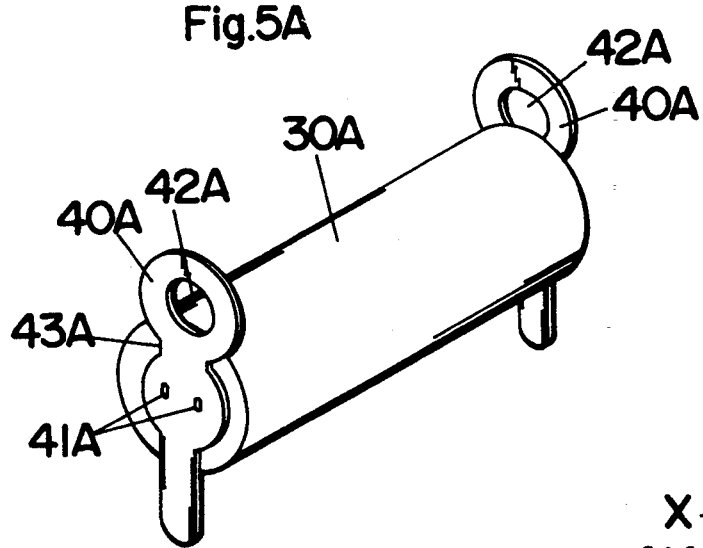
FIGS. 5A and 5B are perspective view and end view, respectively, illustrating the connection between the battery and a terminal strip in accordance with a first modification of the first embodiment.
Figure 5B:
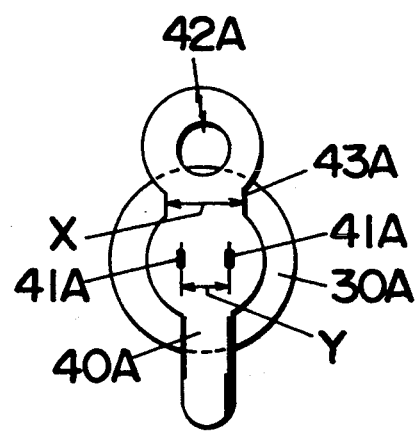

A first modification of the first embodiment is illustrated in FIGS. 5A, 5B and 6. When there is a small space, in an electrical appliance, for moving the tool engaged into a circular opening 42A so as to separate a rechargeable battery 30A from a terminal strip 40A, it is also preferred that two welded portions 41A are arranged along a circumference having the same center of the circular opening 42A and close to the circular opening. In this case, a large external force must be applied to the tool to brake all of the welded portions 41A at once. However, the battery 30A can be separated from the terminal strip 40A by moving the tool engaged into the opening 42A for a short distance. By the way, as shown in FIG. 5B, the terminal strip 40A has a constriction 43A which is positioned between the opening 42A and the welded portion 41A. Generally, in case that a plurality of welded portions are formed on a terminal strip, a pitch between the adjacent welded portions has to be kept as large as possible so as to decrease a loss of welding current during spot welding. However, it is preferred that a width X of the constriction 43A is larger than a pitch Y between the adjacent welded portions 41A. In case that the width X is smaller than the pitch Y, the terminal strip 40A is broken at the constriction 43A when the rechargeable battery 30A is separated from the terminal strip 40A by applying an external force to the tool engaged into the opening 42A. A free end 44A including the circular opening 42A can be bent over the remaining portion 45A of the terminal strip 40A along the constriction 43A, as shown in FIG. 6, such that the rechargeable battery 30A mounted on the circuit board 20A is successfully accommodated within a limited space in the electrical appliance with the free end 44A of the terminal strip 40A free from interfering with the adjacent parts or components.

A second modification of the first embodiment is illustrated in FIG. 7. That is, a terminal strip 40B has a circular opening 42B for engaging the tool for separating a rechargeable battery 30B from the terminal strip 40B and also is connected at two welded portions 41B to one electrode 31B of the battery 30B by spot welding. On the other hand, a pin 60B which is detachably interposed in a cavity 71B of a terminal catch 70B is connected with the other electrode 31B of the battery.

A third modification of the first embodiment is illustrated in FIG. 8. Each electrode 31C of a rechargeable battery 30C is connected at two welded portions 41C to a terminal strip 40C by spot welding. A circular opening 42C for engaging the tool is formed on a free end 43C of the terminal strip 40C. An upper end 44C of the terminal strip 40C is connected to a circuit board 20C through a lead wire 60C. When it is so difficult to cut off the lead wire 60C in order to separate the battery 30C from the circuit board 20C in an electrical appliance, for example, the upper end 44C of the terminal strip and the lead wire 60C is covered with a housing of the electrical appliance, it is preferred that the opening 42C is formed in the free end 43C of the terminal strip 40C so as to easily engage the tool.

A forth modification of the first embodiment is illustrated in FIGS. 9A and 9B. A L-shape terminal strip 40D is connected at two welded portions 41D to a rechargeable battery 30D by spot welding. A circular opening 42D is formed on a free end 43D of the L-shape terminal strip 40D. A contact hole 45D is formed on a lower end 44D of the terminal strip 40D to connect with a circuit board through a lead wire. The welded portions 41D and the opening 42D are arranged along a straight line in a horizontal direction of the terminal strip 40D, as shown in FIG. 9A. On the other hand, as shown in FIG. 9B, two welded portions 41D' are arranged along a straight line in vertical direction of the terminal strip 40D. In case of arrangement of the welded portions 41D of FIG. 9A, when an external force which needs to brake one of the welded portions is x kgf, the external force repeatedly needs to separate the terminal strip 40D from the battery 30D. On the other hand, in case of arrangement of the welded portions 41D' of FIG. 9B, twice external force, that is, 2x kgf, needs at one time to separate the terminal strip 40D from the rechargeable battery 30D. Therefore, when there is enough space, in an electrical appliance, for moving the tool engaged into the opening 42D so as to separate the battery 30D from the terminal strip 40D, it is preferred that the opening 42D and the welded portions 41D are arranged along the straight line.

A fifth modification of the first embodiment is illustrated in FIG. 10. A terminal strip 40E has a rectangular opening 42D which engages a standard-tip screwdriver, as shown in FIG. 10. In this case, as a projection height h, which is a height from a side surface 33E of a rechargeable battery 30E to a top end 43E of the terminal strip 40E, is small, the rechargeable battery 30E connected to a circuit board by the terminal strip 40E can be easily accommodated in an electric appliance without being prevented by the top end 43E extending beyond the periphery of the battery.

Figure 12:
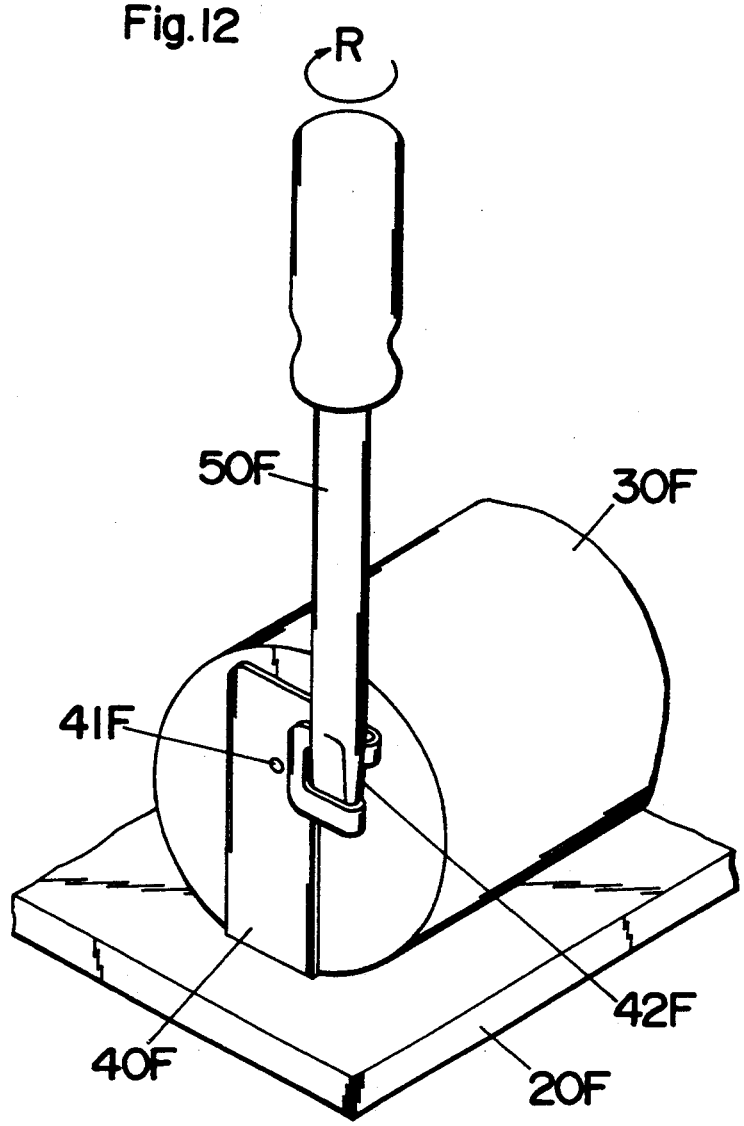
FIGS. 12 is a perspective view showing a process of separating of the rechargeable battery from the terminal strip of the 6th modification.

A sixth modification of the first embodiment is illustrated in FIGS. 11A, 11B and 12. When a free end 43F including a rectangular opening 42F of a terminal strip 40F extends to inside of the periphery of a rechargeable battery 30F, the battery 30F connected to a circuit board 20F by the terminal strip 40F is successfully accommodated within a limited space in an electric appliance as compared with the case of using the terminal strip extending beyond the periphery of the battery as described above. It is also preferred that the free end 43F having the opening 42F is slightly bent with respect to an end surface 32F the battery to form therebetween a gap 44F, so that a tool 50F such as the standard-tip screwdriver can be easily inserted through the opening 42F from the gap 44F between the end surface 32F of the battery and the terminal strip 40F. The tool 50F inserted through the opening 42F is then rotated in the direction of the arrow R so as to separate the terminal strip 40F from the battery 30F, as shown in FIG. 12.

Figure 13:
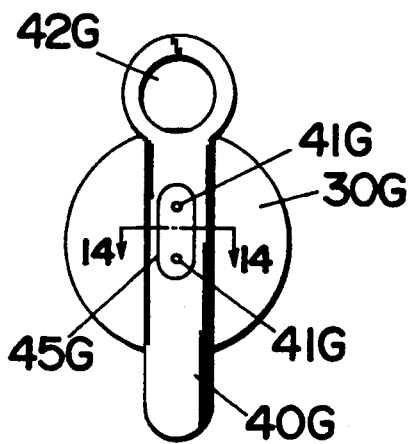
FIG. 13 is an end view illustrating the connection between the battery and a terminal strip having a notch according to a 7th modification of the first embodiment.
Figure 14:
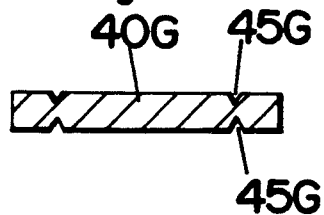
FIG. 14 is a cross sectional view taken substantially on line 13—13 of FIG. 13.
Figure 15:
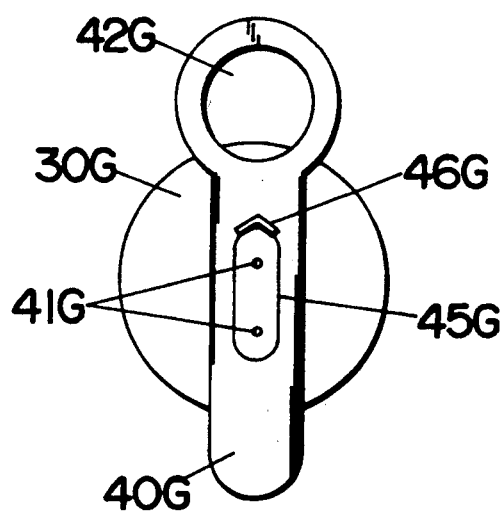
FIG. 15 is an end view illustrating the connection between the battery and a terminal strip having the notch and a slit according to the 7th modification of the first embodiment.

A seventh modification of the first embodiment is illustrated in FIGS. 13 to 15. A notch 45G surrounding two welded portions 41G is formed in the terminal strip 40G such that the terminal strip 40G is cut along the notch 45G while leaving the welded portions 41G adhered to a rechargeable battery 30G when separating the battery from a circuit board. Therefore, the battery 30G is separated from the terminal strip by applying an external force to a tool engaged into a circular opening 42G of the terminal strip 40G. The notch 45G is also formed on both sides of the terminal strip 40G, as shown in FIG. 14. Needless to say, there is no problem with respect to the present invention even if the notch 45G is formed on either side of the terminal strip 40G. On the other hand, as shown in FIG. 15, when a slit 46G is formed in the terminal strip 40G adjacent to the notch 45G, and more preferably between the opening 42G and the notch 45G, the battery 30G can be easily separated from the terminal strip 40G by applying, to the tool engaged into the opening 42G, smaller external force than the external force which needs to separate the battery form the terminal strip 40G without the slit 46G.

Figure 16:
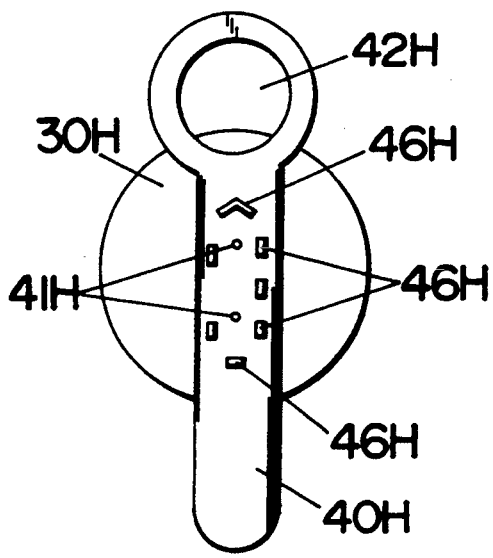
FIG. 16 is an end view illustrating the connection between the battery and a terminal strip having a plurality of slits according to a 8th modification of the first embodiment.

A eighth modification of the first embodiment is illustrated in FIG. 16. A terminal strip 40H having a circular opening 42H is connected at two welded portions 41H to a rechargeable battery 30H by spot welding. It is preferred that a plurality of slit 46H surrounding two welded portions 41H are formed in the terminal strip 40H in place of the notch 45G of 7th modification.

Figure 17:
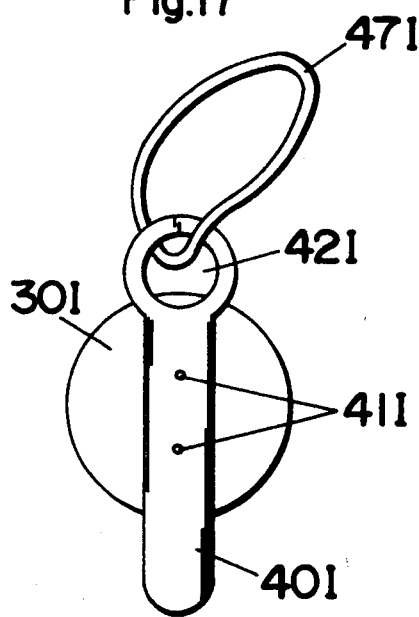
FIG. 17 is an end view of the connection between the battery and a terminal strip according to a 9th modification of the first embodiment.
Figure 18:
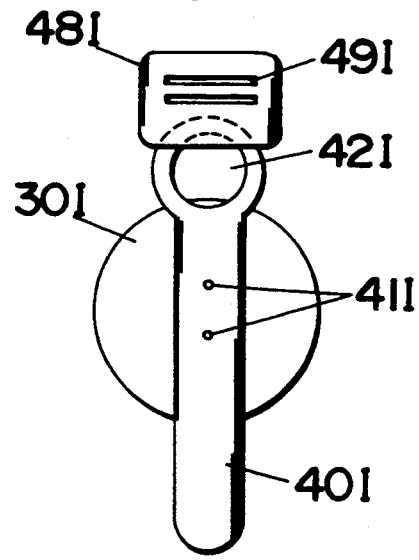
FIG. 18 is an end view of the connection between the battery and a terminal strip according to the 9th modification of the first embodiment.

A ninth modification of the first embodiment is illustrated in FIGS. 17 and 18. When a circular opening 42I formed in a terminal strip 40I is folded so as not to prevent an accommodation of a rechargeable battery 30I, which is connected at two welded portions 41I to the terminal strip 40I by spot welding, in an electrical appliance, it is not easy to engage a tool into the opening 42I in order to separate the battery 30I from the terminal strip 40I. In this case, it is preferred that a ring 47I is attached on the opening 42I, as shown in FIG. 17. Therefore, before the tool is engaged into the opening 42I to separate the battery 30I from the terminal strip 40I, thus folded opening 42I is returned to an original shape of the terminal strip 40I so as to easily engage the tool into the opening 42E by pulling up the ring 47I. By the way, when there is not an optimum tool for separating the battery from the terminal strip, the battery 30I can be separated from the terminal strip 40I by strongly pulling up the ring 47I. However, it is not recommended because there is a possibility that it cause an injury of finger. On the other hand, as shown in FIG. 18, it is also preferred that a pinch 48I having a plurality of knurled portions 49I is attached at an opening 42I in place of the ring 47I.

Figure 19:
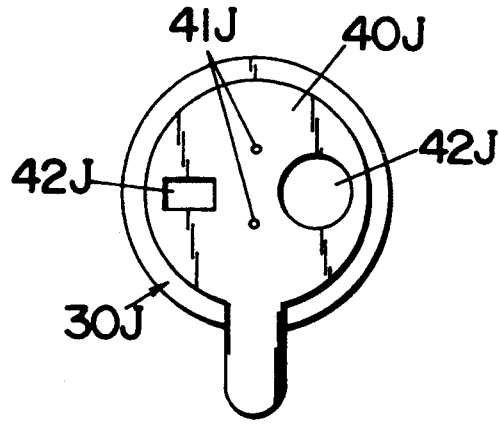
FIG. 19 is an end view illustrating the connection between the battery and a terminal strip having two different openings according to a 10th modification of the first embodiment.
Figure 20:
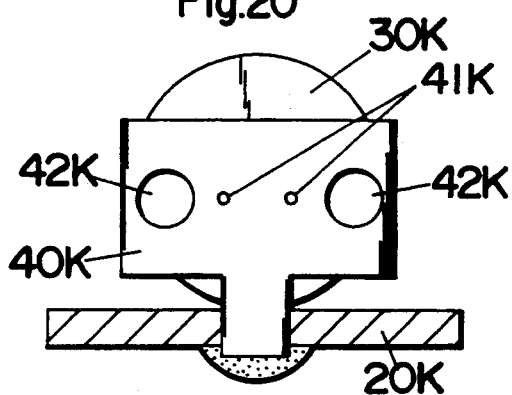
FIG. 20 is an end view illustrating the connection between the battery and a terminal strip having two round openings of the 10th modification.
Figure 21:
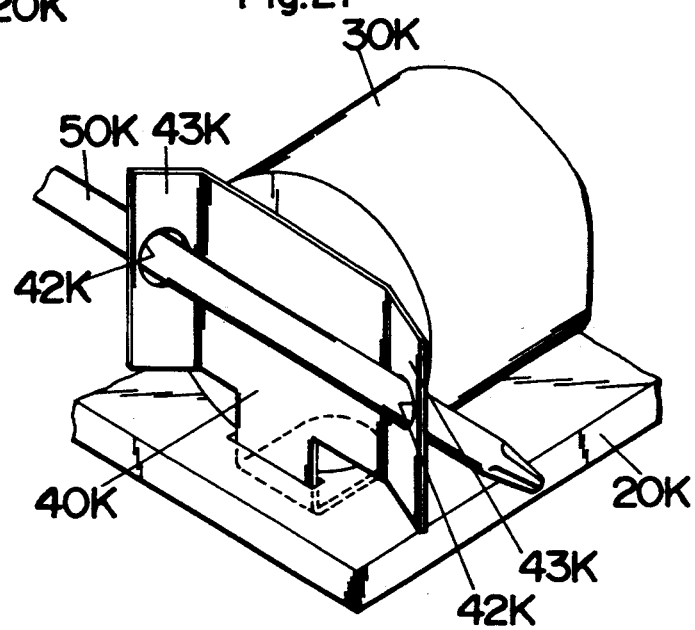
FIG. 21 is a perspective view showing a process of separating of the battery from the terminal strip having two round openings of the 10th modification.
Figure 22A:
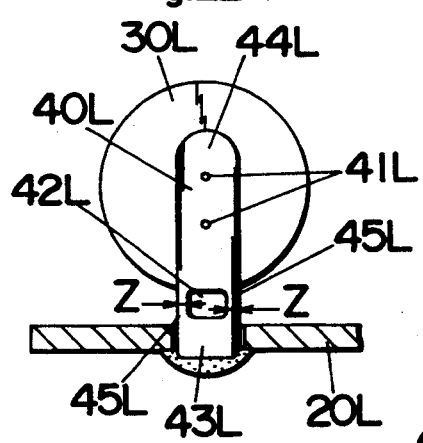
FIGS. 22A and 22B are end view and longitudinal cross sectional view, respectively, illustrating the connection between the battery and a terminal strip according to a 11th modification of the first embodiment.
Figure 22B:
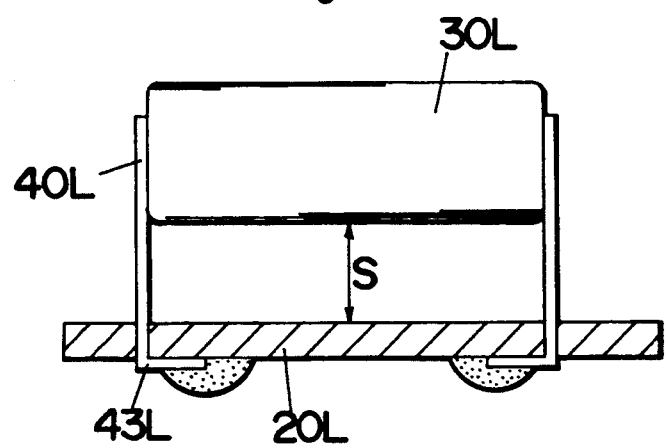

A tenth modification of the first embodiment is illustrated in FIGS. 19, 20 and 21. A terminal strip 40J is formed with a pair of openings 42J which are in the form of a round hole and a rectangular hole. The terminal strip is welded at two welded portions 41J which are arranged between the openings 42J to a rechargeable battery 30J. The openings 42J are respectively engaged with differently shaped tools. Therefore, it is preferred that a plurality of openings having different shapes are foraged in a terminal strip so as to engage into user's various tools. On the other hand, as shown in FIGS. 20 and 21, a pair of circular openings 42K are formed in a terminal strip 40K so as to arrange two welded portions 41K between the openings 42K. A rechargeable battery 30K is connected to a circuit board 20K by the terminal strip 40K. Each free end 43K having the opening 42K is preferably bent, as shown in FIG. 21, so that a stick-like tool 50K such as a screwdriver can be easily introduced through the openings 42K. The terminal strip 40K can be safety separated from the battery 30K by applying an external force to the tool 50K engaged into the openings 42K.

A eleventh modification of the first embodiment is illustrated in FIGS. 22A, 22B, 23A and 23B. An opening 42L is formed in a terminal strip 40N between an anchor end 43L of a terminal strip 40L and two welded portions 41L. Both of side portions 45L connecting between a free end 44L and the anchor end 43L are broken by applying an external force to the tool engaged into the opening 42L, so that a rechargeable battery 30L can be separated from a circuit board 20L. A width Z of each side portion 45L should be small unless the side portion is not broken or deformed by weight of the battery 30L. On the other hand, as the opening 42L needs a considerably gap S extending between the battery 30L and the circuit board 20L in order to engage therein a stick-like tool, it is not desired to make a small electrical appliance. Therefore, as shown in FIGS. 23A and 23B, the terminal strip 40L is folded at the opening 42L and interposed between the battery 30L and the circuit board 20L so as to have a narrowed gap S'. Before the tool is engaged into the opening 42L to separate the battery 30L from the circuit board 20L, thus folded terminal strip 40L is returned to the original shape by inserting the tool in the gap S and then expanding the gap with the tool.

Figure 26:
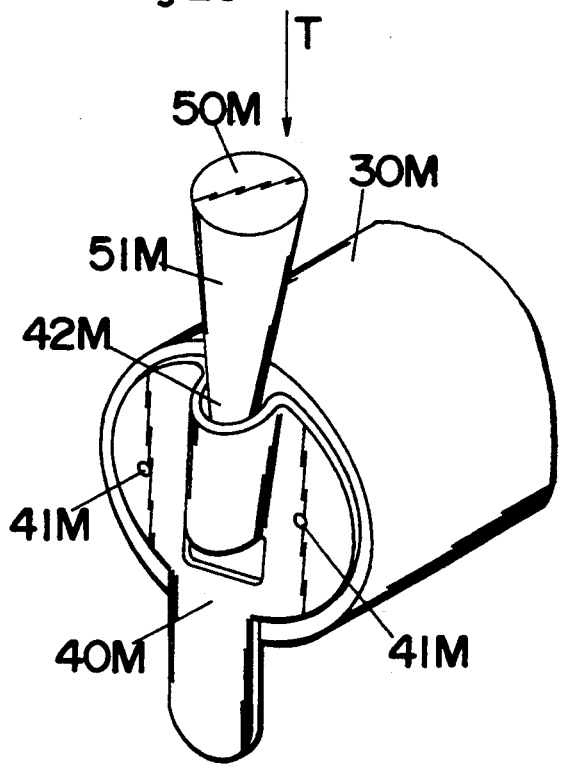
FIG. 26 is a perspective view showing a process for separating the battery from a terminal strip having a tool of the second embodiment.

A second embodiment of the present invention is illustrated in FIGS. 24 to 26. A rechargeable battery 30M is connected at two welded portions 41M to a terminal strip 40M by spot welding. The terminal strip 40M is also connected to the battery 30M so as to form a cylindrical bore 42M for inserting a tool between the terminal strip 40M and an end surface 32M of the battery. Each of the welded portions 41M is arranged on both sides of the cylindrical bore 42M. The battery 30M can be separated from the terminal strip 40M by inserting a stick-like tool into the cylindrical bore 42M and then moving the tool against the end surface 32M of the battery. On the other hand, as shown in FIG. 25, it is also preferred that a tapered cylindrical bore 42M' is formed between the terminal strip 40M' and the end surface 32M of the battery 30M. In this case, the rechargeable battery 30M can be easily separated form the terminal strip 40M' by inserting the stick-like tool into the tapered cylindrical bore 42M' and then pushing down the tool. When the cylindrical bore 42M is fitted with a tool 50M having a tapered shank 51M, as shown in FIG. 26, the battery 30M can be easily separated from the terminal strip simply by pushing down the inserted tool 50M in the direction of the arrow T without relying upon an additional tool. It is equally possible that the tapered tool 50M is fitted into the tapered cylindrical bore 42M' for separating the terminal strip 40M' from the battery 30M in the like manner.

Figure 27A:
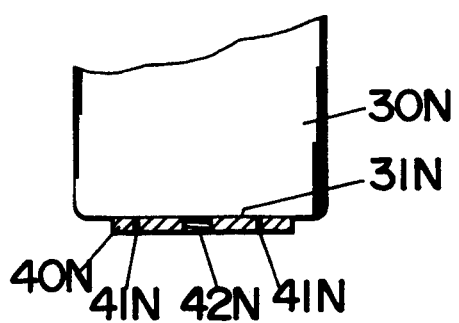
FIGS. 27A and 27B are side view and end view, respectively, illustrating the connection between the battery and a terminal strip in accordance with a third embodiment of the present invention.
Figure 27B:
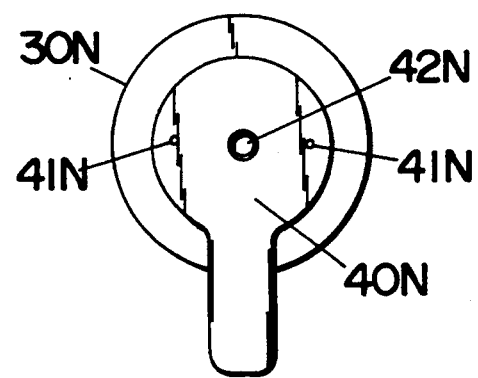

A third embodiment of the present invention is illustrated on FIGS. 27A and 27B. A terminal strip 40N having a thread through-hole 42N which is arranged at a center of the terminal strip 40N is connected at two welded portions 41N to an electrode 31N of a rechargeable battery 30N by spot welding. When a screw (not shown) is tightened in the thread hole 42N, the top of the screw is firstly contact with an electrode 31N of the battery 30N. And then, when the screw is tightened therein more deeply, the electrode 31N of the battery 30N is pushed with the top of the screw so as to space away the battery from the terminal strip 40N, so that the battery 30N can be safety separated from the terminal strip. It is also preferred that the screw is utilized in an electric appliance because the screw as a tool for separating the battery from the terminal strip is always accommodated in the electric appliance.

Figure 28:
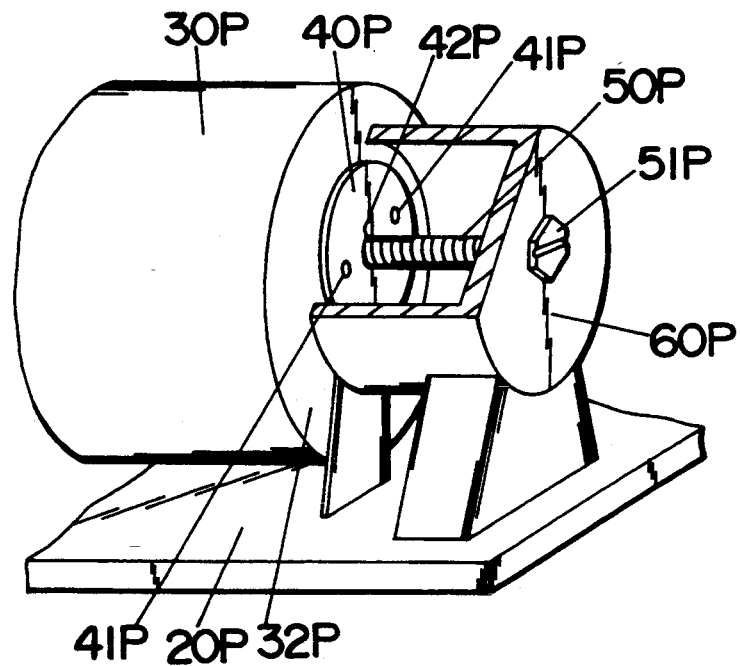
FIG. 28 is a perspective view illustrating the connection between the battery and a terminal strip according to a first modification of the third embodiment.
Figure 29:
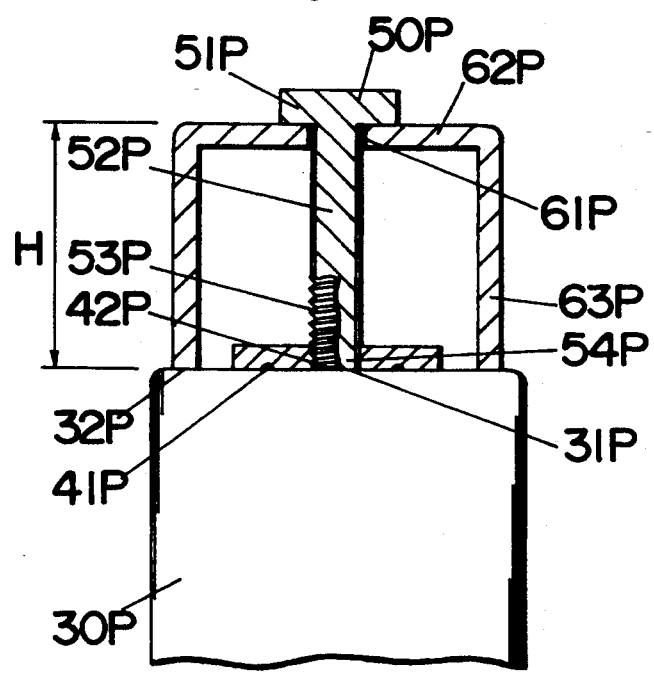
FIG. 29 is a longitudinal cross sectional view of the connection between the battery and the terminal strip of the first modification of the third embodiment.

A first modification of the third embodiment is illustrated in FIGS. 28 and 29. A terminal strip 40P having a thread hole 42P is connected at two welded portions 41P to an electrode 31P of a rechargeable battery 30P by spot welding. A thread portion 53P of a bolt 50P is always thread engaged with the thread hole 42P of the terminal strip 40P so as not to contact a top end 54P of the thread portion 53P with the electrode 31P of the battery 30P. The bolt 50P consists of a head portion 51P, shank portion 52P and thread portion 53P. The shank portion 52P of the bolt is passed through a throughhole 61P which is arranged at a center of top surface 62P of a support base 60P and supported with the through hole. The terminal strip 40P and the support base 60P are secured with a circuit board 20P. A foot 63P of the support base 60P is pushed against an end surface 32P of the battery 30P. A height H of the support base 60P must be equal to a total length of the shank potion 52P and the thread portion 53P. That is to say, the bolt 50P can not be tightened more deeply because the head portion 51P of the bolt 50P contacts with the top surface 62P of the support base 60P. However, the terminal strip 40P thread engaged with the thread portion 53P of the bolt 50P receives a tensile force so as to space away the terminal strip 40P from the electrode 31P of the battery when the bolt 60P is rotated by user. Therefore, the welded portions 41P are broken by the tensile force, so that the rechargeable battery 30P can be safety separated from the terminal strip 40P without causing any damage of the battery.

What is claimed is:

1. An electrical appliance powered by an incorporated rechargeable battery which comprises:

a housing incorporating the rechargeable battery having a positive electrode and a negative electrode together with a circuit board carrying an electrical circuit for operating said appliance;

terminal means connecting said rechargeable battery physically and electrically to said circuit board;

said terminal means including at least one terminal strip which is welded to the positive and negative electrodes of said battery to define a welded portion;

said terminal strip being formed to have an opening for engaging a tool adapted to be utilized for breaking open said welded portion so as to enable disengaging said rechargeable battery from said circuit board at a portion of said terminal strip, wherein said terminal strip is in the form of an elongated member having an anchor end secured to said circuit board and a free end opposite of said anchor end, said free end being formed with said opening at least a portion of which extends beyond the periphery of said battery so as to receive therein said tool.

2. An electrical appliance as set forth in claim 1, wherein said terminal strip is formed with a notch surrounding a welded portion at which said terminal strip is welded to one of the positive and negative electrodes of said rechargeable battery such that said terminal strip is cut along said notch while leaving the welded portion adhered to said rechargeable battery when disengaging said rechargeable battery from said circuit board.

3. An electrical appliance as set forth in claim 1, wherein said terminal strip is welded to one of the positive and negative electrodes of said battery at plural points, said plural points and said opening being arranged along a straight line.

4. An electrical appliance as set forth in claim 1, wherein said terminal strip is formed with a constriction between an end portion including said opening and the welded portion, said terminal strip being made of flexible material such that said end portion can be bent over the remaining portion of said terminal strip along said constriction.

5. An electrical appliance as set forth in claim 1, wherein said terminal means comprises a pair of the terminal strips which are welded to the positive and negative electrodes of said rechargeable battery, respectively, said terminal strips being connected to said circuit board by means of lead wires, respectively.

6. An electrical appliance as set forth in claim 1, wherein said terminal segment is formed at a free end opposite of an anchor end secured to said circuit board with said opening in the form of a rectangular slot adapted to receive therein a standard-tip driver or the like as said tool.

7. An electrical appliance as set forth in claim 9, wherein at least a portion of said rectangular slot projects beyond the periphery of said rechargeable battery.

8. An electrical appliance as set forth in claim 1, wherein said terminal strip is provided with a ring which is engaged with said opening and is adapted to be pulled by a user for disengaging said terminal strip from said rechargeable battery.

9. An electrical appliance as set forth in claim 1, wherein said terminal strip is in the form of an elongated member having an anchor end secured to said circuit board and a free end opposite of said anchor end, said free end being foldable upon the remaining portion of said terminal strip so to be disposed within the confine of a face of the corresponding electrode to which said remaining portion is welded, said free end being provided with a knob which is accessible by a user to unfold said free end to make said opening accessible by said tool.

10. An electric appliance powered by an incorporated rechargeable battery which comprises:

a housing incorporating the rechargeable battery having a positive electrode and a negative electrode together with a circuit board carrying an electrical circuit for operating said appliance;

terminal means connecting said rechargeable battery physically and electrically to said circuit board;

said terminal means including at least one terminal strip which is welded to the positive and negative electrodes of said battery to define a welded portion;

said terminal strip being formed to have an opening for engaging a tool adapted to be utilized for breaking open said welded portion so as to enable disengaging said rechargeable battery from said circuit board at a portion of said terminal strip, wherein said terminal means comprises said terminal strip and a terminal catch secured to said circuit board, one of the positive and negative electrode is in the form of a pin extending from said battery to be detachably engaged with said terminal catch.

11. An electric appliance powered by an incorporated rechargeable battery which comprises:

a housing incorporating the rechargeable battery having a positive electrode and a negative electrode together with a circuit board carrying an electrical circuit for operating said appliance;

terminal means connecting said rechargeable battery physically and electrically to said circuit board;

said terminal means including at least one terminal strip which is welded to the positive and negative electrodes of said battery to define a welded portion;

said terminal strip being formed to have an opening for engaging a tool adapted to be utilized for breaking open said welded portion so as to enable disengaging said rechargeable battery from said circuit board at a portion of said terminal strip, wherein said terminal strip is in the form of a generally L-shaped configuration with a vertical segment and a horizontal segment, said vertical segment being adapted to be connected to said circuit board and said horizontal segment formed with said opening, said terminal strip being welded at a juncture portion between said vertical and horizontal segments.

12. An electric appliance powered by an incorporated rechargeable battery which comprises:

a housing incorporating the rechargeable battery having a positive electrode and a negative electrode together with a circuit board carrying an electrical circuit for operating said appliance;

terminal means connecting said rechargeable battery physically and electrically to said circuit board;

said terminal means including at least one terminal strip which is welded to the positive and negative electrodes of said battery to define a welded portion;

said terminal strip being formed to have an opening for engaging a tool adapted to be utilized for breaking open said welded portion so as to enable disengaging said rechargeable battery from said circuit board at a portion of said terminal strip, wherein said terminal strip is formed with a base segment and a tab integrally extending from said base sediment and including said opening, said base segment being welded to one of the positive and negative electrodes of said rechargeable battery, said tab extending in an inclined manner with respect to a face of the corresponding electrode to said face to provide therebetween a gap through which said tool is accessible to said opening, said tab being foldable upon said base segment as said tool inserted into said opening rotates such that a further rotation of said tool causes said terminal strip to be disengaged from said electrode at a welded portion of said base member to said electrode.

13. An electrical appliance as set forth in claim 12, wherein said tab extends within a confine of said face.

14. An electrical appliance as set forth in claim 13, wherein said terminal strip, is formed with at least one slit adjacent said notch.

15. An electric appliance powered by an incorporated rechargeable battery which comprises:
a housing incorporating the rechargeable battery having a positive electrode and a negative electrode together with a circuit board carrying an electrical circuit for operating said appliance;
terminal means connecting said rechargeable battery physically and electrically to said circuit board;
said terminal means including at least one terminal strip which is welded to the positive and negative electrodes of said battery to define a welded portion;
said terminal strip being formed to have an opening for engaging a tool adapted to be utilized for breaking open said welded portion so as to enable disengaging said rechargeable battery from said circuit board at a portion of said terminal strip,
wherein said terminal strip is formed with a pair of said openings which are in the form of a round hole and a rectangular hole, respectively for selective engagement with differently shaped tools.

16. An electric appliance powered by an incorporated rechargeable battery which comprises:
a housing incorporating the rechargeable battery having a positive electrode and a negative electrode together with a circuit board carrying an electrical circuit for operating said appliance;
terminal means connecting said rechargeable battery physically and electrically to said circuit board;
said terminal means including at least one terminal strip which is welded to the positive and negative electrodes of said battery to define a welded portion;
said terminal strip being formed to have an opening for engaging a tool adapted to be utilized for breaking open said welded portion so as to enable disengaging said rechargeable battery from said circuit board at a portion of said terminal strip,
wherein said terminal strip is formed at its opposite ends with said openings, respectively, said terminal strip being welded to said rechargeable battery at a point arranged along a line extending between said two openings.

17. An electric appliance powered by an incorporated rechargeable battery which comprises:
a housing incorporating the rechargeable battery having a positive electrode and a negative electrode together with a circuit board carrying an electrical circuit for operating said appliance;
terminal means connect said rechargeable battery physically and electrically to said circuit board;
said terminal means including at least one technical strip which is welded to the positive and negative electrodes of said battery to define a welded portion;
said terminal strip being formed to have an opening for engaging a tool adapted to be utilized for breaking open said welded portion so as to enable disengaging said rechargeable battery from said circuit board at a portion of said terminal strip,
wherein said terminal strip is an elongated member with a lower anchor end secured to said circuit board and an upper end welded to the corresponding electrode of said rechargeable battery, said opening being located between said lower anchor end and said upper end in such a manner as to define between said opening and lateral sides of said terminal strip constrictions at which said terminal strip is to be cut off by an action of said tool inserted through said opening, said terminal strip being foldable at said constrictions to have a portion adjacent said constrictions disposed between said circuit board and a bottom of said rechargeable battery.

18. An electric appliance powered by an incorporated rechargeable battery which comprises:
a housing incorporating the rechargeable battery having a positive electrode and a negative electrode together with a circuit board carrying an electrical circuit for operating said appliance;
terminal means connecting said rechargeable battery physically and electrically to said circuit board;
said terminal means including at least one terminal strip which is welded to the positive and negative electrodes of said battery to define a welded portion;
said terminal being strip formed to have an opening for engaging a tool adapted to be utilized for breaking open said welded portion so as to enable disengaging said rechargeable battery from said circuit board at a portion of said terminal strip,
wherein said opening is cooperative with an end face of the corresponding electrode to define a generally cylindrical bore which is adapted to receive a tip of said tool.

19. An electrical appliance as set forth in claim 18, wherein, said cylindrical bore is fitted with a tapered tip of said tool.

20. An electrical appliance as set forth in claim 18, wherein said cylindrical bore is tapered to be narrower toward an inner end than at an outer end of said terminal strip.

21. An electric appliance powered by an incorporated rechargeable battery which comprises:
a housing incorporating the rechargeable battery having a positive electrode and a negative electrode together with a circuit board carrying an electrical circuit for operating said appliance;

terminal means connecting said rechargeable battery physically and electrically to said circuit board;

said terminal means including at least one terminal strip which is welded to the positive and negative electrodes of said battery to define a welded portion;

said terminal strip being formed to have an opening for engaging a tool adapted to be utilized for breaking open said welded portion so as to enable disengaging said rechargeable battery from said circuit board at a portion of said terminal strip, wherein said opening is a threaded through-hole adapted to be in threaded engagement with said tool such that as said tool is rotated with its tip abutted against the corresponding electrode of said rechargeable battery, said terminal strip receives a counter force which acts to move said terminal strip away from said electrode for disengaging it therefrom by breaking the welded portion between the terminal strip and said electrode.

22. An electric appliance powered by an incorporated rechargeable battery which comprises:

a housing incorporating the rechargeable battery having a positive electrode and a negative electrode together with a circuit board carrying an electrical circuit for operating said appliance;

terminal means connecting said rechargeable battery physically and electrically to said circuit board;

said terminal means including at least one terminal strip which is welded to the positive and negative electrodes of said battery to define a welded portion;

said terminal strip being formed to have an opening for engaging a tool adapted to be utilized for breaking open said welded portion so as to enable engaging said rechargeable battery from said circuit board at a portion of said terminal strip;

wherein said opening of said terminal strip is a threaded hole adapted to be in threaded engagement with a tip of said tool, and further including a fitting with a top plate and a foot extending from said top plate to abut against an end face of the corresponding electrode outwardly of said terminal strip, said top plate formed with a through hole through which said tool extends in such a manner that said tool rotates freely in said through hole, said tool formed with a head which abuts against the exterior face of said top plate to inhibit the axial movement thereof toward said terminal strip such that when rotating said tool to advance the top thereof relatively into said threaded hole in said terminal strip, said terminal strip is caused to pull away from said end face of the corresponding electrode, thereby being disengaged therefrom by breaking the welded portion between said terminal strip and the corresponding electrode.

* * * * *